United States Patent
Liskow

(10) Patent No.: US 11,191,174 B2
(45) Date of Patent: Nov. 30, 2021

(54) TRANSMISSION CONTROL APPARATUS AND METHOD FOR FASTENING A SIGNAL INPUT ELEMENT TO A CIRCUIT BOARD ELEMENT OF A TRANSMISSION CONTROL APPARATUS

(71) Applicant: Robert Bosch GmbH, Stuttgart (DE)

(72) Inventor: Uwe Liskow, Shanghai (CN)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 16/469,515

(22) PCT Filed: Oct. 20, 2017

(86) PCT No.: PCT/EP2017/076849
§ 371 (c)(1),
(2) Date: Jun. 13, 2019

(87) PCT Pub. No.: WO2018/108363
PCT Pub. Date: Jun. 21, 2018

(65) Prior Publication Data
US 2019/0394892 A1    Dec. 26, 2019

(30) Foreign Application Priority Data

Dec. 13, 2016  (DE) ..................... 10 2016 224 799.9

(51) Int. Cl.
*H05K 5/00* (2006.01)
*H05K 1/18* (2006.01)
*H05K 3/32* (2006.01)

(52) U.S. Cl.
CPC .......... *H05K 5/0069* (2013.01); *H05K 1/184* (2013.01); *H05K 3/326* (2013.01); *H05K 5/0082* (2013.01);
(Continued)

(58) Field of Classification Search
CPC ...... H05K 5/0069; H05K 1/184; H05K 3/326; H05K 5/0082; H05K 2201/10151; H05K 2201/1031; H05K 2201/09072
See application file for complete search history.

(56) References Cited

U.S. PATENT DOCUMENTS 6,427,539 B1 *  8/2002  Chen et al.  ........... G01L 9/0064
                                                           73/726

FOREIGN PATENT DOCUMENTS

DE        197 17 348 A1    10/1998
DE    10 2010 029 868 A1    12/2011
(Continued)

OTHER PUBLICATIONS

International Search Report corresponding to PCT Application No. PCT/EP2017/076849, dated Feb. 2, 2018 (German and English language document) (5 pages).

*Primary Examiner* — James Wu
*Assistant Examiner* — Hung Q Dang
(74) *Attorney, Agent, or Firm* — Maginot, Moore & Beck LLP

(57) ABSTRACT

A transmission control apparatus, particularly for a motor vehicle, includes a circuit board element, a signal input element, a base, and a first fixing layer. The base includes a hollow space for receiving at least a part of the signal input element and is fastened on a first surface of the circuit board element. The signal input element is at least partially fastened in the hollow space and is electrically connected to the circuit board element via the base. The circuit board element includes a cut-out for inserting the signal input element into the hollow space through the circuit board element. The first fixing layer is configured for sealing the area between the
(Continued)

base and the circuit board element and is arranged on the first surface of the circuit board element and on a part of the base.

12 Claims, 3 Drawing Sheets

(52) U.S. Cl.
CPC ................ *H05K 2201/1031* (2013.01); *H05K 2201/10151* (2013.01)

(56) References Cited

FOREIGN PATENT DOCUMENTS

| | | | |
|---|---|---|---|
| DE | 102010029868 | * 12/2011 | ....... F16H 2059/683 |
| DE | 10 2011 088 037 A1 | 6/2013 | |
| DE | 10 2014 224 033 A1 | 5/2016 | |
| JP | 2006-164539 A | 6/2006 | |
| JP | 2015-153595 A | 8/2015 | |

* cited by examiner

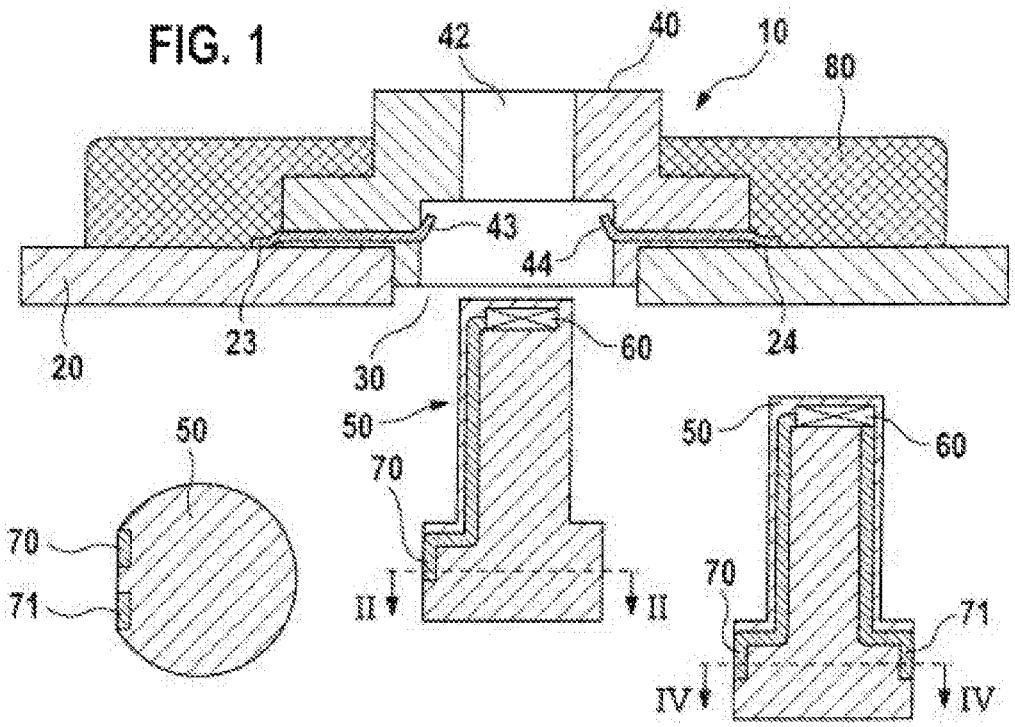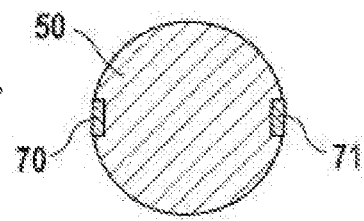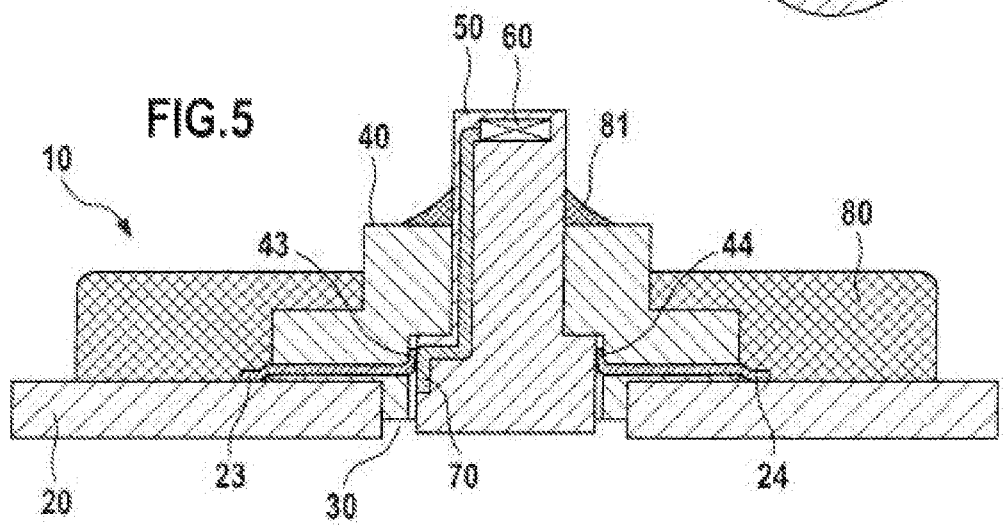

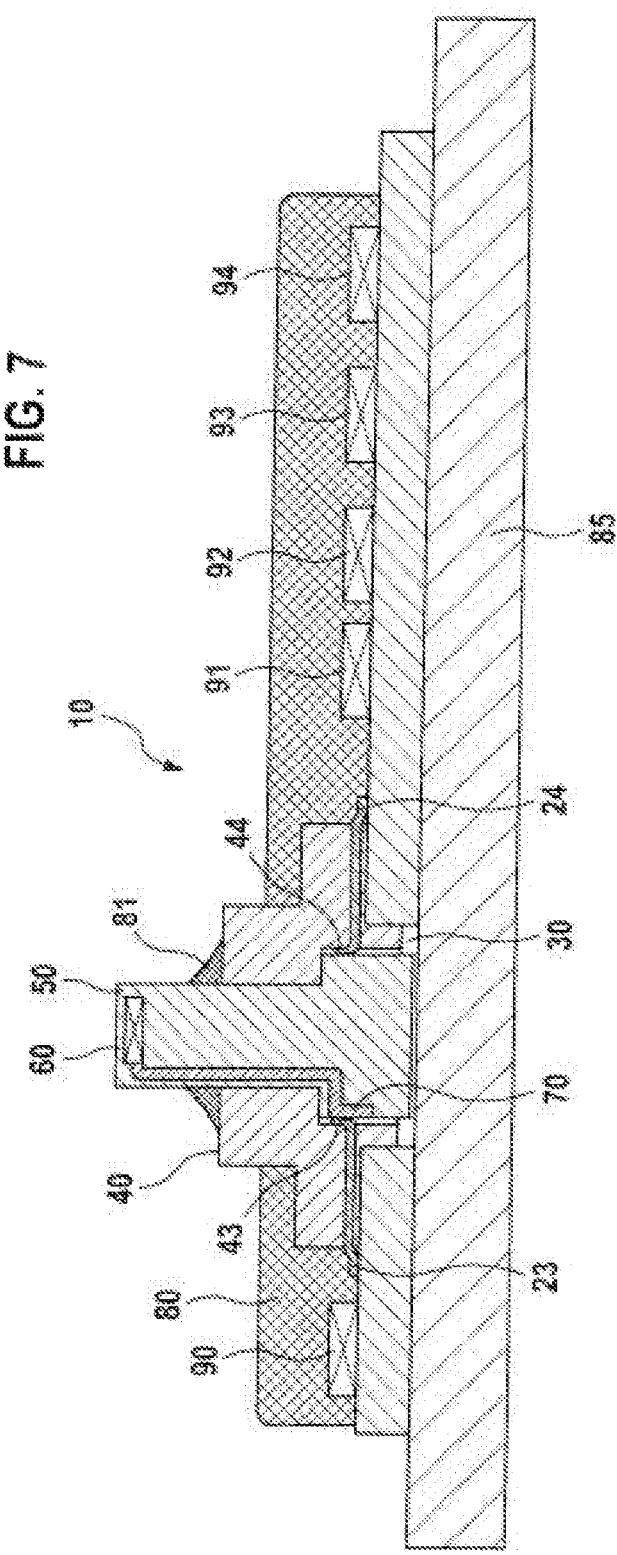

TRANSMISSION CONTROL APPARATUS AND METHOD FOR FASTENING A SIGNAL INPUT ELEMENT TO A CIRCUIT BOARD ELEMENT OF A TRANSMISSION CONTROL APPARATUS

This application is a 35 U.S.C. § 371 National Stage Application of PCT/EP2017/076849, filed on Oct. 20, 2017, which claims the benefit of priority to Serial No. DE 10 2016 224 799.9, filed on Dec. 13, 2016 in Germany, the disclosures of which are incorporated herein by reference in their entirety.

The disclosure relates to a transmission control apparatus and to a method for attaching a signal input element to a circuit board element of a transmission control apparatus.

BACKGROUND

In the case of transmission control apparatuses known up until now that comprise a circuit board element, signal input elements for inputting a signal into the circuit board element (for example a sensor device and/or a plug connection) are attached to the circuit board elements for example by screws or rivet connections or integrated into them. The connection lines protruding from the signal input element are plugged into the circuit board element or into flex foils (plug-through solder contacts are used in this case) or into relaying leadframes and welded or soldered thereto. These leadframes, flex foils or circuit board elements connect the signal input element to a central transmission controller iTCU or a transmission plug.

The disadvantage of this is that the position of the signal input element (sensor or plug connection) is fixed in relation to the circuit board element, and changing the position normally requires a fundamental change in design of the circuit board element. Furthermore, it is generally technically difficult to create the electrical connection between the signal input element and the circuit board element or the like.

SUMMARY

Embodiments of the disclosure may advantageously make it possible to arrange a signal input element on the circuit board element of the transmission control apparatus in a technically simple manner.

According to a first aspect of the disclosure, what is proposed is a transmission control apparatus, in particular for a motor vehicle, comprising a circuit board element, wherein a base having a cavity for receiving at least part of a signal input element is attached to a first surface of the circuit board element, wherein the signal input element is at least partly attached in the cavity and is electrically connected to the circuit board element via the base, wherein the circuit board element has an opening for the insertion of the signal input element into the cavity through the circuit board element, and wherein a first fixing layer for sealing the area between the base and the circuit board element is arranged on the first surface of the circuit board element and on part of the base.

One advantage of this is that the signal input element is generally attached to the circuit board element and is electrically connected thereto in a technically simple manner. In addition, the signal input element may generally comprise an inexpensive thermoplastic material or consist thereof, since the signal input element was introduced into the cavity of the base only after the reflow soldering. The signal input element therefore generally does not have to withstand temperatures of around 250° C. to around 270° C. that are typically present in a reflow soldering oven. Other materials are therefore generally possible for the signal input element. The signal input element may normally be a sensor device having a sensor or a plug connection (male or female). In addition, the height, that is to say the distance of the upper surface of the signal input element or of the sensor device or of the plug connection to the first (upper) surface of the circuit board element may normally be greater than the otherwise normal maximum permitted population height (for example 25 mm to 30 mm) that is predefined by the free height in the reflow soldering oven. Transmission control apparatuses having signal input elements or sensor devices or plug connections that have a maximum distance (distance of the upper furthest away surface) from the first surface of the circuit board element of around 25 mm to around 100 mm and more to the first surface are therefore generally possible. The signal input element may in particular generate electrical signals and transmit these to the circuit board element (sensor device) or transmit electrical signals from another source to the circuit board element (plug connection).

According to a first aspect of the disclosure, what is proposed is a method for attaching a signal input element to a circuit board element of a transmission control apparatus, in particular for a motor vehicle, wherein the method comprises the following steps: providing the circuit board element, wherein the circuit board element has an opening for the insertion of the signal input element; arranging a base having connection elements on a first surface of the circuit board element, wherein the base substantially surrounds the opening on the first surface of the circuit board element and the base has a cavity for receiving the signal input element; electrically connecting the connection elements to the circuit board element; applying a first fixing layer to the first surface of the circuit board element and to part of the base in order to seal the area between the base and the circuit board element; curing the first fixing layer; and inserting the signal input element through the opening of the circuit board element into the cavity of the base and attaching the signal input element to the circuit board element.

One advantage of this is that the signal input element is generally attached to the circuit board element and electrically connected thereto in a technically simple manner. In addition, the signal input element may generally comprise an inexpensive thermoplastic material or consist thereof, since the signal input element is introduced into the cavity of the base only after the reflow soldering. The signal input element therefore generally does not have to withstand temperatures of around 250° C. to around 270° C. that are typically present in a reflow soldering oven. Other materials are therefore generally possible for the signal input element. The signal input element may normally be a sensor device having a sensor or a plug connection (male or female). In addition, the height, that is to say the distance of the upper surface of the sensor device or of the plug connection to the first (upper) surface of the circuit board element may normally be greater than the otherwise normal maximum permitted population height (for example 25 mm to 30 mm) that is predefined by the free height in the reflow soldering oven. Transmission control apparatuses having sensor devices or plug connections that have a maximum distance (distance of the upper furthest away surface) from the first surface of the circuit board element of around 25 mm to around 100 mm and more to the first surface are therefore generally able to be manufactured in this way. The signal input element may in particular generate electrical signals and transmit these to the circuit board element (sensor device) or transmit electrical signals from another source to the circuit board element (plug connection).

Ideas for embodiments of the disclosure may be considered to be based, inter alia, on the concepts and knowledge described below.

According to one embodiment, the signal input element has a recess, arranged at least partly outside the cavity, for receiving a second fixing layer. One advantage of this is that a particularly secure connection between the signal input element and the base is typically present.

According to one embodiment, the signal input element is electrically connected to the circuit board element via connection elements of the base, wherein the connection elements protrude from the base into the cavity in the direction of the signal input element. This generally creates an electrical connection between the signal input element and the circuit board element in a technically simple manner.

According to one embodiment, the connection elements are designed so as to be flexible, wherein the signal input element is attached to the circuit board element by way of the connection elements. One advantage of this is that the signal input element is generally connected at the same time mechanically and electrically to the base or the circuit board element in a technically simple manner. The signal input element is additionally typically able to be attached inside the cavity at different positions or different insertion depths.

According to one embodiment, part of the signal input element protrudes from the base on a side of the base facing away from the circuit board element. As a result of this, good and technically simple signal detection (by the sensor device) or signal transmission (by the plug connection) is generally present, and it is possible to connect a plug in a technically simple manner.

According to one embodiment, the base is designed so as to taper in the direction away from the circuit board element. One advantage of this is that positioning of the signal input element in the cavity is generally able to be performed in a precise and technically simple manner.

According to one embodiment, in each case a part of the connection elements protrudes into the cavity, wherein that part of the respective connection element that protrudes into the cavity is designed so as to be flexible, and wherein the signal input element is attached to the circuit board element by way of those parts of the connection elements that protrude into the cavity. One advantage of this is that the signal input element is generally able to be connected at the same time mechanically and electrically to the base or to the circuit board element in a technically simple manner.

According to one embodiment, the signal input element is able to be fixed in the cavity at various positions in a direction perpendicular to the first surface of the circuit board element. One advantage of this is that the signal input element is typically able to be attached inside the cavity at different positions or different insertion depths. As a result of this, a distance of a sensor of the sensor device to the device whose values are intended to be detected is generally able to be set in a technically simple manner.

According to one embodiment, the method furthermore comprises the following step: applying a second fixing layer to part of the base and part of the signal input element in order to attach the signal input element to the base. One advantage of this is that a secure and technically simple attachment of the signal input element to the base is generally achieved.

It is pointed out that some of the possible features and advantages of the disclosure are described herein with reference to different embodiments of the transmission control apparatus. A person skilled in the art is aware that the features may be suitably combined, adjusted or exchanged in order to arrive at further embodiments of the disclosure.

BRIEF DESCRIPTION OF THE DRAWINGS

Embodiments of the disclosure are described below with reference to the attached drawings, wherein neither the drawings nor the description should be interpreted as restricting the disclosure.

FIG. 1 shows a cross-sectional view of a first embodiment of the transmission control apparatus according to the disclosure before the sensor device has been inserted into the cavity;

FIG. 2 shows a cross-sectional view of the sensor device from FIG. 1 along the line II-II;

FIG. 3 shows a cross-sectional view of a second embodiment of the sensor device;

FIG. 4 shows a further cross-sectional view of the sensor device from FIG. 3 along the line IV-IV;

FIG. 5 shows a cross-sectional view of the transmission control apparatus from FIG. 1 after the sensor device has been inserted into the cavity;

FIG. 7 shows a cross-sectional view of the transmission control apparatus from FIG. 5, wherein the transmission control apparatus is arranged on a baseplate.

Figure 6:
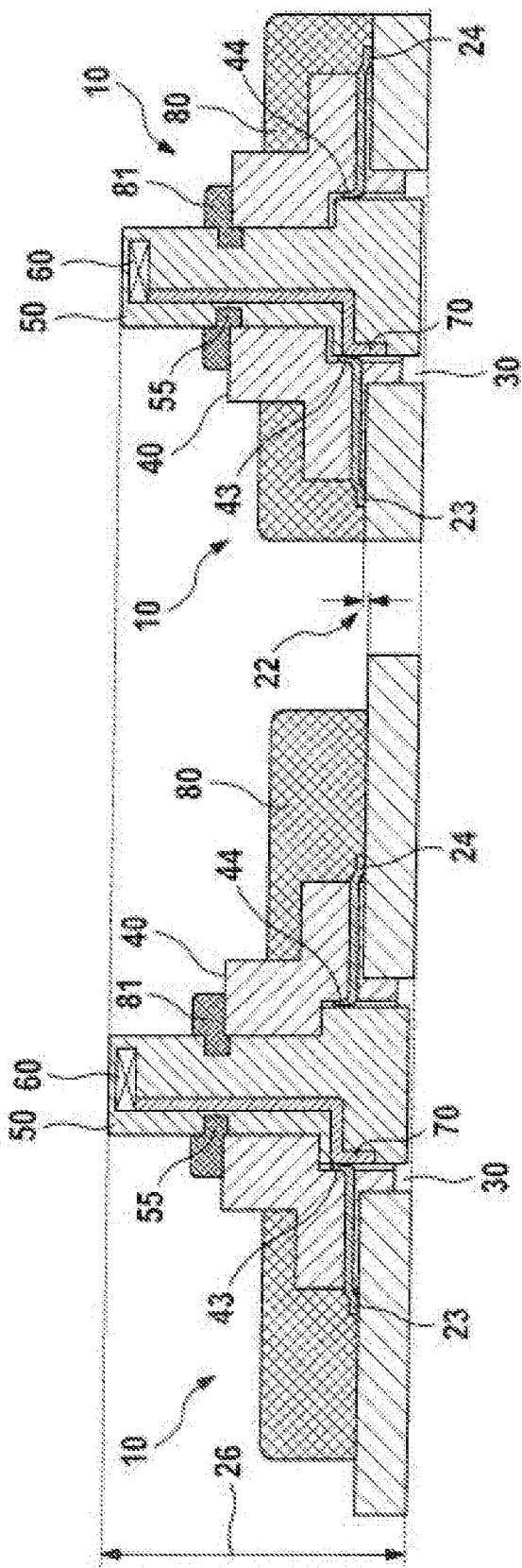
FIG. 6 shows a cross-sectional view of a second embodiment and of a third embodiment of the transmission control apparatus according to the disclosure after the sensor device has been inserted into the cavity.

The figures are purely schematic and not to scale. Identical reference signs in the figures denote identical or functionally identical features.

DETAILED DESCRIPTION

FIG. 1 shows a cross-sectional view of a first embodiment of the transmission control apparatus 10 according to the disclosure before the sensor device has been inserted into the cavity 42. FIG. 2 shows a cross-sectional view of the sensor device from FIG. 1 along the line II-II. FIG. 3 shows a cross-sectional view of a second embodiment of the sensor device. FIG. 4 shows a further cross-sectional view of the sensor device from FIG. 3 along the line IV-IV. FIG. 5 shows a cross-sectional view of the transmission control apparatus 10 from FIG. 1 after the sensor device has been inserted into the cavity 42.

The transmission control apparatus 10 comprises a circuit board element 20, for example a printed circuit board (PCB), a base 40 and a signal input element 50. The signal input element 50 inputs electrical signals into the circuit board element 20. The signal input element 50 generates electrical signals itself and transmits them to the circuit board element 20 (sensor device) or transmits electrical signals from another source to the circuit board element 20 (plug connection).

The sensor device comprises a sensor 60. The sensor 60 may be for example a sensor 60 for detecting the rotational speed.

The transmission control apparatus 10 is designed to control a transmission, in particular of a motor vehicle.

Instead of a sensor device, a plug connection for connection to a connection plug is also possible. Only a sensor device is discussed below, but the embodiments apply, mutatis mutandis, to a plug connection as well. Further elements may be electrically connected to the circuit board element 20 by way of the plug connection, and signals may thereby be transmitted by further elements to the circuit board element or input into the circuit board element 20. The plug connection may be a male or a female plug or a plug housing for receiving a plug.

The circuit board element 20 has an opening 30 that extends over the entire height of the circuit board element 20. The height of the circuit board element 20 runs from the bottom upward in FIG. 1.

The base 40 is arranged on a first surface (the upper surface in FIG. 1) of the circuit board element 20. The base 40 is also partly arranged in the opening 30. The base 40 has a cavity 42 that is designed so as to be complementary to the sensor device. The cavity 42 tapers in stages from the bottom upward. The sensor device accordingly tapers from the bottom upward in FIG. 1. At least that part of the sensor device that is received in the cavity 42 is designed so as to taper. That part of the sensor device protruding from the cavity 42 (upward in FIG. 5) may again be wider than a part of the sensor device that is arranged in the cavity 42.

The base 40 has two connection elements 43, 44 that are arranged on mutually opposing sides of the base 40. The base 40 is electrically connected to the circuit board element 20 or the electronic component (not shown) on the circuit board element 20 by way of the connection elements 43, 44. For this purpose, the connection elements 43, 44 protrude from the base 40 on a side facing away from the cavity 42. The connection elements 43, 44 are electrically connected to the circuit board at this point. This may be achieved for example by SMD soldering. The connection elements 43, 44 are electrically connected to the circuit board element 20 by way of SMD solder points 23, 24.

A respective part of the connection elements 43, 44 protrudes from the base 40 into the cavity 42. The sensor device is pushed or guided through the opening 30 of the circuit board element 20 through the circuit board element 20 and pushed into the cavity 42 of the base 40.

The connection elements 43, 44 or that part of the connection elements 43, 44 that protrudes in each case from the base 40 into the cavity 42 may be designed so as to be flexible. The sensor device may be fixed by the connection elements 43, 44 in various positions at which the sensor device has been inserted at different depths into the cavity 42 or attached to the circuit board element 20.

The sensor device may have two, three, four or more connection lines 70, 71 that are electrically connected to the sensor 60 and that are designed for electrical connection to the connection elements 43, 44 of the base 40. In the case of a plug connection, the connection lines 70, 71 of the plug connection are able to be electrically connected to the plug that is able to be connected to the plug connection.

The connection lines 70, 71 may run parallel to one another (see FIG. 2). As an alternative, the connection lines 70, 71 may be arranged on opposing sides of the sensor device (see FIG. 3 or FIG. 4). A situation whereby conductive deposits that trigger a short circuit between the connection lines 70, 71 are able to form between the connection lines 70, 71 is thereby avoided, as the distance between the two connection lines 70, 71 is as large as possible. In the case of connection lines 70, 71 running parallel to one another, the formation of conductive deposits that trigger a short circuit between the connection lines 70, 71 is able to be prevented by a web or a protrusion being formed or being present between the connection lines 70, 71.

Even if the electrically active connection lines 70, 71 are both or all arranged on one side of the sensor device (see FIG. 2), the base 40 may have connection elements 43, 44 that protrude into the cavity 42 on mutually opposing sides of the cavity 42. This means that non-electrically active connection elements 43, 44 may also be used to fix and laterally press the sensor device. It is thereby possible to achieve a particularly even and/or symmetrical attachment of the sensor device in the base 40.

FIG. 6 shows a cross-sectional view of a second embodiment and of a third embodiment of the transmission control apparatus 10 according to the disclosure after the sensor device has been inserted into the cavity 42. The second embodiment of the transmission control apparatus 10 according to the disclosure after the sensor device has been inserted into the cavity 42 is able to be seen in the left-hand part or region of FIG. 6. The third embodiment of the transmission control apparatus 10 according to the disclosure after the sensor device has been inserted into the cavity 42 is able to be seen in the right-hand part or region of FIG. 6.

The height or thickness of the circuit board element 20 (the height or thickness runs from the bottom upward in FIG. 6) may vary according to manufacture. The thickness or height of the circuit board element 20 may be for example 1.6 mm±0.15 mm. The height difference 22 is illustrated by the connecting lines between the left-hand part of FIG. 6 and the right-hand part of FIG. 6. Due to the variable insertion depth of the sensor device into the cavity 42, it is possible to precisely set a distance of the sensor 60 to a device whose properties are intended to be measured. Due to the variable insertion depth of the sensor device into the cavity 42, it is possible to compensate different heights or thicknesses of the circuit board element 20. This means that the distance between the sensor 60 and the second surface, facing away from the first, or the underside of the circuit board element 20 or the overall height 26 of the transmission control apparatus 10 may always be set so as to be the same (see left-hand part of FIG. 6 or second embodiment and right-hand part of FIG. 6 or third embodiment).

In the second embodiment, shown in the left-hand part of FIG. 6, of the transmission control apparatus 10 according to the disclosure, the sensor device is pushed (upward) into the cavity 42 until it comes to a stop or as far as it is able to go. There may be a certain play (in a direction parallel to the first surface of the circuit board element 20) between the sensor device and the base 40.

In the right-hand part of the third embodiment, shown in FIG. 6, of the transmission control apparatus 10 according to the disclosure, the sensor device is pushed (upward) into the cavity 42 not until it comes to a stop or not as far as it is able to go, but rather a distance is present between the sensor device and the base 40 in the height direction.

The sensor device may have a recess 55 or a constriction that is at least partly exposed when the sensor device is inserted into the cavity 42, that is to say is situated outside the cavity 42 of the base 40. The recess 55 may be designed selectively or partly or so as to completely surround the sensor device. The recess 55 is used to receive the material of a second fixing layer 81. The second fixing layer 81 may be for example an adhesive and/or a lacquer. The second fixing layer 81 is applied to a part (the upper part) of the base 40 and a part of the sensor device that protrudes upward from the cavity 42 of the base 40. A particularly secure attachment of the sensor device to the base 40 or to the circuit board element 20 is thereby achieved. Locking of the sensor device in terms of height is additionally thereby achieved.

The recess 55 is advantageous in particular if the second fixing layer 81 adheres better to the base 40 than to the sensor device. The recess 55 is also in particular advantageous if the base 40 has a coefficient of thermal expansion that differs from the coefficient of thermal expansion of the sensor device. This is possible for example if the base 40 consists of thermoset material having a coefficient of thermal expansion of around 20 ppm/K, the second fixing layer 81 has a coefficient of thermal expansion of around 15 ppm/K to around 25 ppm/K and the sensor device has a coefficient of thermal expansion of around 65 ppm/K. The circuit board element 20 normally has a coefficient of thermal expansion of around 18 ppm/K.

FIG. 7 shows a cross-sectional view of the transmission control apparatus 10 from FIG. 5, wherein the transmission control apparatus 10 is arranged on a baseplate 85.

The transmission control apparatus 10 may be arranged on a baseplate 85. The baseplate 85 may be for example part of the transmission housing that receives the transmission. The sensor device is thereby sealed from below and the opening 30 in the circuit board element 20 in an oil-tight manner.

The sensor device is pushed into the cavity 42 until the sensor device does not protrude downward (in FIG. 7) from the circuit board element 20.

The transmission control apparatus 10 is manufactured as follows. A circuit board element 20 (for example a printed circuit board; PCB) is first of all provided with an opening 30 or a hole. A base 40 is then applied or arranged or formed around the opening 30 (possibly also partly in the opening 30) on a first surface of the circuit board element 20 (the upper surface of the circuit board element 20 in FIG. 5). This may for example take place during the process of populating the circuit board element 20 with electronics. The base 40 may be positioned and fixed beforehand over its collar (which is arranged in the opening 30) in the opening 30 and/or using pins.

The base 40 has a cavity 42 for receiving the sensor device and connection elements 43, 44 that protrude partly into the cavity 42. The connection elements 43, 44 pass through the base 40 for example in the horizontal direction and protrude from the base 40 on that side of the base 40 facing away from the cavity 42. This outwardly protruding part of the connection elements 43, 44 is electrically connected to the circuit board element 20 or electronic components 90-94 on the circuit board element 20 (for example by way of SMD solder points 23, 24). A first fixing layer 80 or a casting compound is then applied to the first surface of the circuit board element 20 and the base 40 and cured (for example thermally or through radiation energy). The first fixing layer 80 ensures secure attachment of the base 40 to the circuit board element 20. At the same time, the first fixing layer 80 seals the electrical connections between the connection elements 43, 44 and the circuit board element 20 in an oil-tight manner.

The sensor device, which has a sensor 60 and connection elements 43, 44, is then inserted through the opening 30 into the cavity 42 of the base 40. The sensor 60 may be for example an ASIC, IC and/or a coil. The sensor 60 may be arranged on a surface of the sensor device or may be arranged in the sensor device. The sensor device has an (outer) form that corresponds to the form of the cavity 42. Both are designed so as to be complementary to one another, as it were. The sensor device is inserted in accordance with the desired distance between the sensor 60 and the lower surface (which lies opposite the first surface) of the circuit board element 20. An air gap between the sensor 60 and the object to be measured or to be detected (sensor target), for example a trigger wheel or a position magnet, is thereby for example able to be set to a desired value in a technically simple manner, independently of manufacturing tolerances of the height or thickness of the circuit board element 20.

The connection elements 43, 44 or that part of the connection elements 43, 44 that protrudes into the cavity 42 may be designed so as to be flexible. The connection elements 43, 44 form a typical flexible contact point. The connection elements 43, 44 press (laterally) against the sensor device (in particular against one or more connection lines 70, 71 of the sensor devices) and thus clamp the sensor device between them. The sensor device is thereby able to be locked at different positions (in terms of height, which runs from the bottom upward in FIG. 1). The positions may be continuous in terms of height. At the same time, an electrical connection to the connection lines 70, 71 of the sensor device and therefore to the sensor 60 is produced by way of the connection elements 43, 44. A second fixing layer 81 may then optionally be applied to part of the base 40 and to part of the sensor device (that protrudes upwardly from the base 40) and cured (for example thermally or through radiation energy). The second fixing layer 81 locks the sensor device in terms of height. It is also conceivable for the connection elements 43, 44 not to be designed so as to be flexible, but rather for locking of the sensor device in terms of height to take place exclusively by way of the second fixing layer 81.

The second fixing layer 81 may be an adhesive, a casting compound and/or a lacquer. The second fixing layer 81 may be for example epoxy resin or an epoxy resin adhesive or a polyacrylate or polyacrylate adhesive.

The first fixing layer 80 may be an adhesive, a casting compound and/or a lacquer. The first fixing layer 80 may be for example epoxy resin or an epoxy resin adhesive or a polyacrylate or a polyacrylate adhesive.

The first fixing layer 80 and the second fixing layer 81 may consist of the same material.

If the sensor 60 of the sensor device is arranged on an outer surface of the sensor device, the second fixing layer 81 may also cover the sensor 60. It is also conceivable for the second fixing layer 81 to cover the entire or complete part of the sensor device that protrudes upwardly from the base 40. Oil-tight coverage of the sensor device is therefore able to be achieved.

The first fixing layer 80 is arranged contiguously on the circuit board element 20. The second fixing layer 81 is arranged contiguously on the base 40 and the signal device.

The sensor device has a sensor dome, the sensor 60 and connection lines 70, 71. The sensor 60 is arranged in the sensor dome or on an outer surface of the sensor dome. The sensor dome or the sensor device may comprise inexpensive thermoplastic material or consist thereof, since the sensor device is inserted into the cavity 42 of the base 40 only after the reflow soldering. The sensor device therefore does not have to withstand temperatures of around 250° C. to around 270° C. that are typically present in a reflow soldering oven. Thermoset material is conceivable instead of or in addition to thermoplastic material.

The height, that is to say the distance of the upper surface of the sensor device to the first (upper) surface of the circuit board element 20, may additionally be greater than the otherwise normal maximum permitted population height (for example 25 mm to 30 mm) that is predefined by the free height in the reflow soldering oven. Transmission control apparatuses 10 having sensor devices that have a maximum distance (distance of the upper furthest away surface) from the first surface of the circuit board element 20 of around 25 mm to around 100 mm and more to the first surface are therefore possible.

It should finally be pointed out that terms such as "having", "comprising", etc. do not exclude any other elements or steps, and terms such as "a", "an" or "one" do not exclude a multiplicity.

The invention claimed is:

1. A transmission control apparatus, comprising:
a circuit board element including a first surface and an opening;
a signal input element;
a base including a cavity configured to receive at least part of the signal input element, the base attached to the first surface of the circuit board element, the signal input element at least partly attached in the cavity and electrically connected to the circuit board element via the base;
a first fixing layer arranged on the first surface of the circuit board element and on part of the base, the first fixing layer configured to seal an area between the base and the circuit board element; and
a second fixing layer arranged on part of the base on a side of the circuit board element on which the first surface is arranged,
wherein the opening of the circuit board element is configured for insertion of the signal input element into the cavity through the circuit board element, and
wherein the signal input element includes a recess arranged at least partly outside the cavity and configured to receive the second fixing layer.

2. The transmission control apparatus as claimed in claim 1, further comprising:
a plurality of connection elements of the base configured to electrically connect the signal input element to the circuit board element,
wherein the connection elements are at least partially embedded in the base and protrude from the base into the cavity in a direction of the signal input element.

3. The transmission control apparatus as claimed in claim 2, wherein:
the connection elements are configured to be flexible; and
the connection elements attach the signal input element to the circuit board element.

4. The transmission control apparatus as claimed in claim 1, wherein part of the signal input element protrudes from the base on a side of the base facing away from the circuit board element.

5. The transmission control apparatus as claimed in claim 1, wherein an outer periphery of the base is configured to taper inwardly in a direction away from the circuit board element.

6. The transmission control apparatus as claimed in claim 1, wherein the transmission control apparatus is for a motor vehicle.

7. The transmission control apparatus as claimed in claim 1, wherein the base has a flanged portion that abuts a portion of the first surface of the circuit board element.

8. The transmission control apparatus as claimed in claim 7, wherein the base has the flanged portion that extends laterally outward and overlaps a portion of the first surface of the circuit board element.

9. The transmission control apparatus as claimed in claim 1, wherein the circuit board element includes a second surface that faces opposite the first surface, and wherein the signal input element, when received in the cavity of the base, is positioned at least partially within the opening and does not extend beyond the second surface.

10. A transmission control apparatus, comprising:
a circuit board element including a first surface and an opening;
a signal input element;
a base including a cavity configured to receive at least part of the signal input element, the base attached to the first surface of the circuit board element, the signal input element at least partly attached in the cavity and electrically connected to the circuit board element via the base; and
a first fixing layer arranged on the first surface of the circuit board element and on part of the base, the first fixing layer configured to seal an area between the base and the circuit board element,
wherein the opening of the circuit board element is configured for insertion of the signal input element into the cavity through the circuit board element, and
wherein an outer periphery of the base is configured to taper inwardly in a direction away from the circuit board element.

11. A transmission control apparatus, comprising:
a circuit board element including a first surface and an opening;
a signal input element;
a base including a cavity configured to receive at least part of the signal input element, the base attached to the first surface of the circuit board element, the signal input element at least partly attached in the cavity and electrically connected to the circuit board element via the base; and
a first fixing layer arranged on the first surface of the circuit board element and on part of the base, the first fixing layer configured to seal an area between the base and the circuit board element,
wherein the opening of the circuit board element is configured for insertion of the signal input element into the cavity through the circuit board element, and
wherein the base has a flanged portion that abuts a portion of the first surface of the circuit board element.

12. A transmission control apparatus, comprising:
a circuit board element including a first surface and an opening;
a signal input element;
a base including a cavity configured to receive at least part of the signal input element, the base attached to the first surface of the circuit board element, the signal input element at least partly attached in the cavity and electrically connected to the circuit board element via the base; and
a first fixing layer arranged on the first surface of the circuit board element and on part of the base, the first fixing layer configured to seal an area between the base and the circuit board element,
wherein the opening of the circuit board element is configured for insertion of the signal input element into the cavity through the circuit board element, and
wherein the circuit board element includes a second surface that faces opposite the first surface, and wherein the signal input element, when received in the cavity of the base, is positioned at least partially within the opening and does not extend beyond the second surface.

* * * * *